United States Patent [19]

Kojima et al.

[11] Patent Number: 5,037,674

[45] Date of Patent: Aug. 6, 1991

[54] METHOD OF CHEMICALLY VAPOR DEPOSITING A THIN FILM OF GAAS

[75] Inventors: Seiji Kojima, Tokyo; Masakiyo Ikeda, Yokoyama; Hiroshi Kikuchi, Tokyo; Yuzo Kashiwayanagi, Yokosuka, all of Japan

[73] Assignee: The Furukawa Electric Co., Ltd., Tokyo, Japan

[21] Appl. No.: 462,348

[22] Filed: Jan. 3, 1990

Related U.S. Application Data

[63] Continuation of Ser. No. 307,499, Feb. 8, 1989, abandoned, which is a continuation of Ser. No. 204,974, Jun. 3, 1989, abandoned, which is a continuation of Ser. No. 868,142, May 29, 1986, abandoned.

[30] Foreign Application Priority Data

May 29, 1985 [JP] Japan ................................ 60-115739

[51] Int. Cl.$^5$ .......................... B05D 5/12; C23C 16/46
[52] U.S. Cl. ................................ 427/255; 427/255.2; 427/255.7; 156/613; 156/614; 437/133
[58] Field of Search ................ 427/255, 255.2, 255.7; 437/96, 107, 133, 225, 236; 156/613, 614

[56] References Cited

U.S. PATENT DOCUMENTS

| | | | |
|---|---|---|---|
| 3,893,876 | 7/1975 | Akai et al. ................... | 427/255.2 |
| 4,000,716 | 1/1977 | Kurata et al. ............... | 427/255.2 |
| 4,159,354 | 6/1979 | Milnes et al. ............... | 427/255.2 |
| 4,171,235 | 10/1979 | Fraas et al. ................ | 427/255.2 |
| 4,188,244 | 2/1980 | Itoh et al. .................. | 427/255.2 |
| 4,213,801 | 7/1980 | Johnston .................... | 427/113 |
| 4,233,092 | 11/1980 | Harris et al. ............... | 427/255.2 |
| 4,250,205 | 2/1981 | Constant et al. ............ | 427/255.2 |
| 4,267,014 | 5/1981 | Davey et al. ................ | 427/255.2 |
| 4,320,178 | 3/1982 | Chemla et al. .............. | 437/225 |
| 4,404,265 | 9/1983 | Manasevit ................... | 428/697 |
| 4,561,916 | 12/1985 | Akiyama et al. ............ | 437/233 |
| 4,756,792 | 7/1980 | Fujita et al. ................ | 156/613 |

FOREIGN PATENT DOCUMENTS 53-35383 4/1978 Japan ................................ 437/233

OTHER PUBLICATIONS

Harrison et al., "Preparaton of III-V Compounds", IBM Technical Disclosure, vol. 4, No. 1, Jun. 1961.
Bass et al., "Controlled Doping of Gallium Arsenide Produced by Vapour Epitaxy, Using Trimethyl Gallium and Arsine" Inst. Phys. Conf. Ser. No. 336, 1977.
Wang et al., "Single and Polycrystalline GaAs Solar Cells Using OM-CVB" Chemical Vapor Deposition, pp. 249-260, 1979.
Mori et al., "AlGaAs Grown by Metalorganic Chemical Vapor Deposition for Visible Laser" J. Appl. Phys. 52(4), Apr. 1981, pp. 2792-2798.

Primary Examiner—Michael Lusignan
Assistant Examiner—Margaret Burke
Attorney, Agent, or Firm—Oblon, Spivak, McClelland, Maier & Neustadt

[57] ABSTRACT

Doped thin films of GaAs are chemically vapor deposited by depositing a high resistant buffer layer of GaAs on a GaAs substrate by gaseous reaction of a mixture of arsine gas and trimethylgallium in the gas phase over the substrate while the temperature of the substrate is maintained within the range of 600°-700° C., stopping the supply of trimethylgallium to the gas mixture undergoing reaction and increasing the temperature of the substrate to within the range of 700°-800° C., and then resuming the supply of trimethylgallium to and supplying hydrogen sulfide to the gas phase over the substrate at the stated temperature, thereby depositing a doped GaAs layer over the buffer layer on the substrate having a distribution of carrier density of less than 5%.

4 Claims, 4 Drawing Sheets

METHOD OF CHEMICALLY VAPOR DEPOSITING A THIN FILM OF GAAS

This application is a continuation of application Ser. No. 07/307,499, filed on Feb. 8, 1989, now abandoned, which is a continuation of Ser. No. 07/204,974 filed June 3, 1989 now abandoned, which is a continuation of Ser. No. 06/868,142 filed May 29, 1986 now abandoned.

BACKGROUND OF THE INVENTION

The present invention relates to a vapor deposition method for the GaAs thin film by which it has been made possible particularly to manufacture the wafer with a small dispersion in the distribution of the carrier density of the film of deposited n-type crystals.

In general, for the vapor deposition for the GaAs thin film, a vapor deposition apparatus shown in FIG. 4 is used, wherein a high-frequency induction heating coil (5) is provided around the outer circumference of a reaction tube (1) with an introductory port (2) of source gases at the upper end and an exhaust port (3) of gases at the lower end through a cooling jacket (4) and a carbon susceptor (6) in the shape of truncated hexagonal pyramid is arranged in the reaction tube (1). With this apparatus GaAs substrates (7) are fitted onto the pyramid faces of the susceptor (6) and, allowing the susceptor to rotate in the direction of arrow mark, source gases are introduced into the reaction tube (1) from the introductory port (2) and allowed to eject from the exhaust port (3) at the lower end.

In this way, the substrates (7) are heated to a predetermined temperature by the heating coil (5) and, through the thermal decomposition of stock gases near the surface of the substrates (7), the crystals of GaAs are allowed to deposit onto the substrates (7).

As the source gases, organic gallium, for example, trimethyl gallium [$Ga(CH_3)_3$] and arsine gas ($AsH_3$) are used. The deposition conditions to allow the high resistance GaAs layer to deposit are generally that the supplying ratio (V/III) of the source gases of $Ga(CH_3)_3$ and $AsH_3$ lies between 10 and 20 and the temperature of the substrate is near 650° C. Moreover, for the formation of n-type film (a carrier density of not less than $1 \times 10^{16}$ cm$^{-3}$), gas having an impurity possible to become the source for the supply of electrons as an ingredient element is to be added to both stock gases. As the impurity, sulfur is used most frequently and, as the gas containing this, hydrogen sulfide gas ($H_2S$) is used. By varying the flow rate of this gas, the concentration of electrons, that is, the carrier density of n-type crystals is controlled.

For example, for the deposition of epitaxial wafer used for field effect transistor, high resistance crystal film (hereinafter abbreviated as buffer layer) is allowed to deposit onto the GaAs substrate in a thickness of 2 to 3 μm and n-type crystal film (hereinafter abbreviated as doping layer) is allowed to deposit thereon in a thickness of about 0.5 μm. The buffer layer is made from non-dope crystals added no impurity intentionally and is allowed to deposit making the supplying ratio (V/III) 10 to 20 since the carrier density becomes lowest and the resistivity becomes lowest within a range of the supplying ratio (V/III) of $AsH_3$ and $Ga(CH_3)_3$ of 10 to 20. In succession $H_2S$ is added to these gases and the doping layer is allowed to deposit at the same deposition temperature as that in case of the buffer layer.

Although the carrier density of the depositing doping layer can be controlled by the flow rate of $H_2S$ to be added to source gases as described above, it depends also on other deposition conditions. Namely, the carrier density of the doping layer varys also with the supplying ratio (VIII) of the source gases of $AsH_3$ and $Ga(CH_3)_3$ and further with the flow rate of $Ga(CH_3)_3$ or the temperature of the substrate. As a result, in the crystal deposition of the wafer with a large area, there has been a problem that the dispersion is caused in the distribution of the carrier density of the face of wafer due to the temperature distribution on susceptor, the difference in the decomposition ratio of $AsH_3$ resulting from the location on susceptor, or the like.

SUMMARY OF THE INVENTION

As a result of various investigations in view of the situation, a vapor deposition method of wafer has been developed, wherein the dispersion in the distribution of the carrier density of the face of wafer is small in the treatment of wafer with a large area by means of the vapor deposition. Namely, the invention is characterized in that, in the method wherein arsine gas and organic gallium gas are allowed to react through thermal decomposition by heating the GaAs substrate in a mixed stream of both gases and further $H_2S$ is added to both gases to allow the doping layer to deposit, the temperature of the substrate is raised to 700° to 800° C. and kept thereat to allow the doping layer to deposit, wherein supplying ratio (V/III) of source gases is made between 10 and 20.

DETAILED DESCRIPTION OF THE INVENTION

Figure 4:
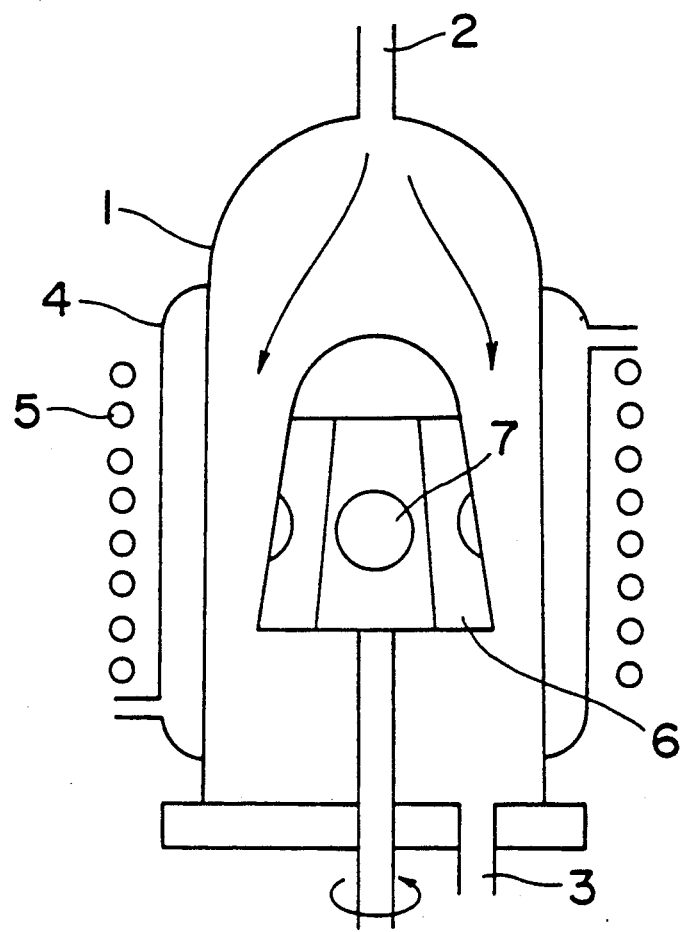
FIG. 4 is an illustration diagram showing one example of the vapor deposition apparatus. In the last diagram, 1 is a reaction tube, 2 is an introductory port of source gases, 3 is an exhaust port, 4 is a cooling jacket, 5 is a high-frequency induction heating coil, 6 is a susceptor, and 7 is a GaAs substrate.

According to the invention, a vapor deposition apparatus, for example, the apparatus shown in FIG. 4 is employed, and, at the time when the doping layer is allowed to deposit through the thermal decomposition reaction by using arsine gas and organic gallium gas and further by adding hydrogen sulfide gas the substrate is kept at 700° to 800° C. for the deposition.

In the invention, by raising and keeping the temperature of the substrate at 700° to 800° C. for the deposition of doping layer onto the GaAs substrate, the dispersion in the distribution of the carrier density of doping layer decreases to within 5%. The reason why the distribution of the carrier density of doping layer descreases by keeping the temperature of the GaAs substrate at high temperature is not clear, but, as the temperature becomes high, the carrier density is lowered and the dispersion in the distribution of the carrier density becomes also small. Here, the reason why the temperature of the substrate was confined to 700° to 800° C. is due to the facts that the dispersion in the distribution of the carrier density cannot be suppressed within 5% if the temperature of the substrate is lower than 700° C., and the disadvantages appear in the crystallinity of wafer obtained and in others if the temperature exceeds 800° C.

EXAMPLE

Employing the apparatus shown in FIG. 4 and using $AsH_3$ and $Ga(CH_3)_3$ for source gases, the buffer layer was allowed to deposit in a thickness of about 2 μm onto the GaAs substrate having a diameter of 2 inches. Thereafter, the temperature of the substrate was raised to respective temperatures of 600°, 650°, 710° and 750° C. and, adding $H_2S$ to both gases described above, the doping layer having a thickness of about 0.5 μm was allowed to deposit to manufacture the epitaxial wafer for field effect transistor.

Besides, the molar fraction of $H_2S$ to whole carrier gas was made $1.83 \times 10^{-6}$, the molar fraction of $Ga(CH_3)_3$ was made $1.23 \times 10^{-4}$, and the molar fraction of $AsH_3$ was made $1.23 \times 10^{-3}$.

Of the wafer with a diameter of 2 inches thus deposited the carrier density within a diameter of 40 mm on the doping layer and the dispersion in the distribution of the carrier density within a diameter of 40 mm at respective locations within a diameter of 2 inches were measured. The results thereof are shown in FIG. 1 and FIG. 2.

Figure 1:
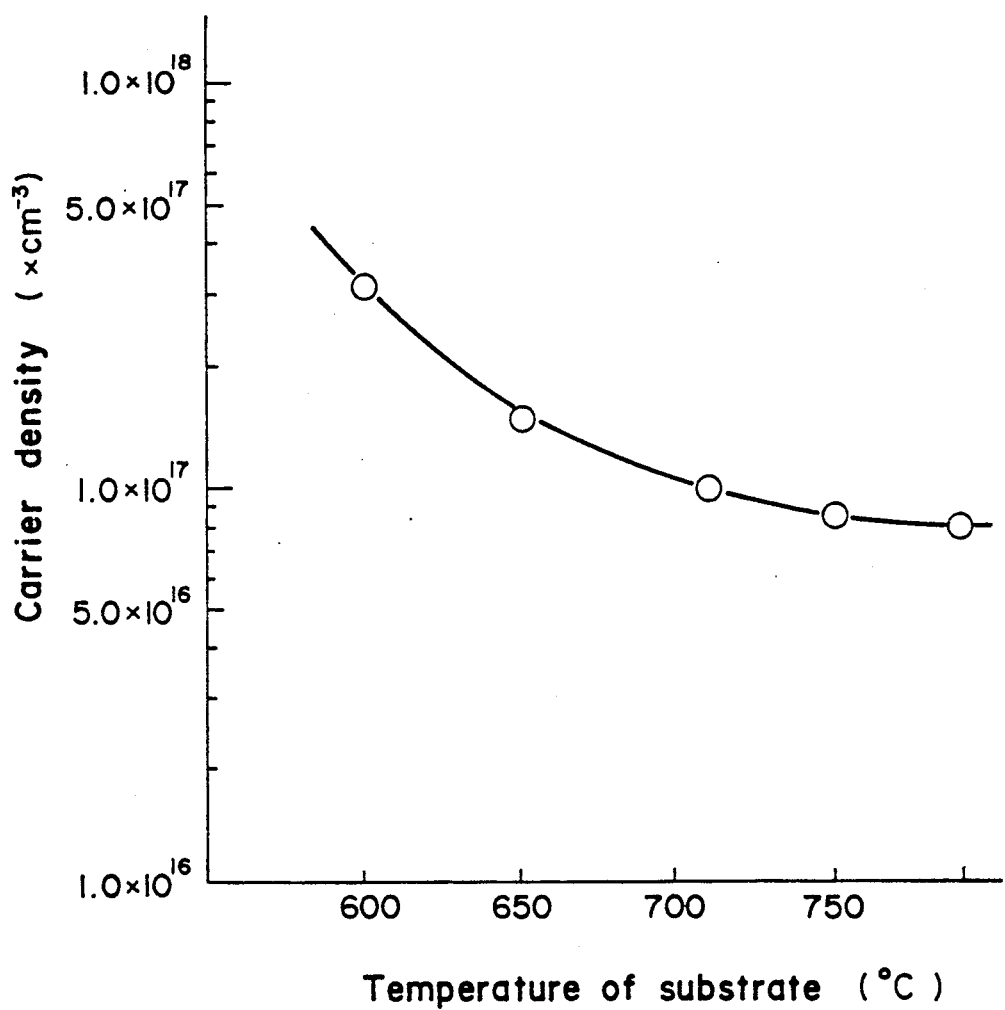
FIG. 1 is an illustration diagram showing the relationship between the temperature of the substrate and the carrier density of the doping layer deposited.
Figure 2:
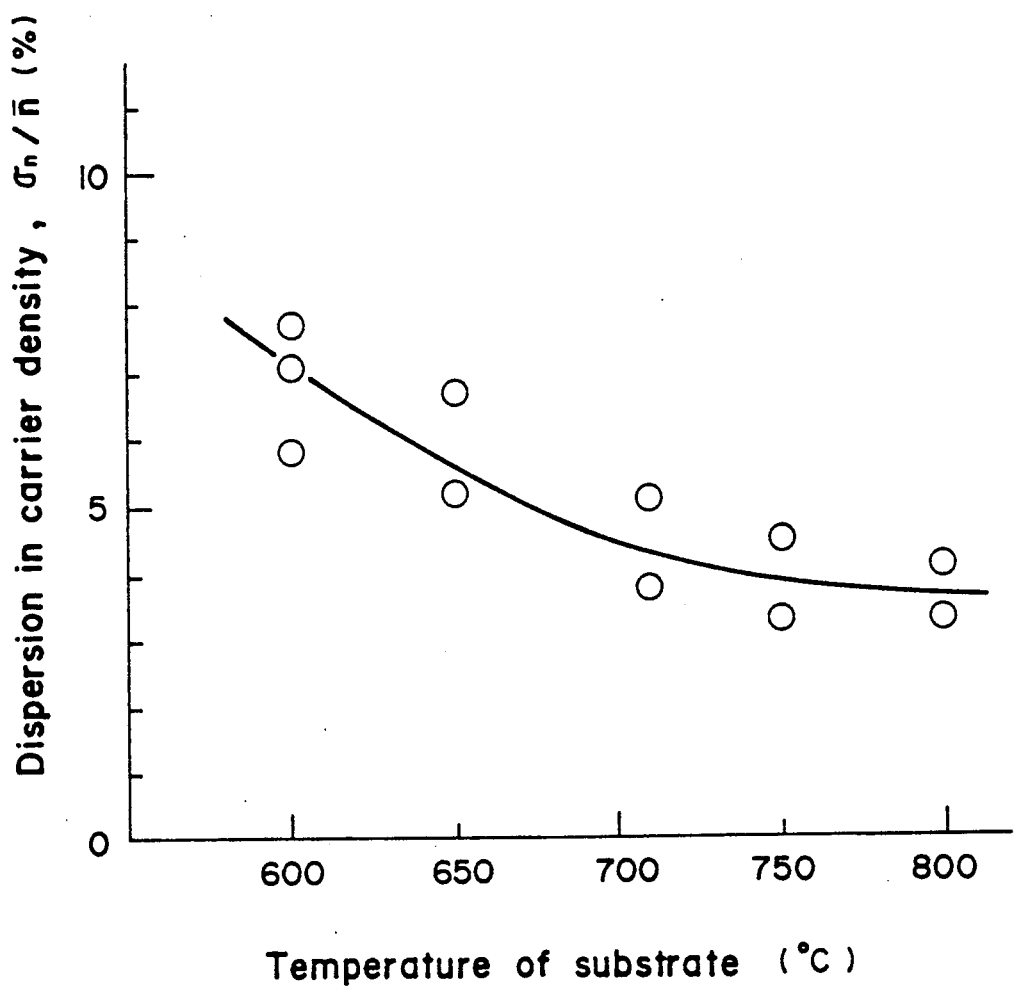
FIG. 2 is an illustration diagram showing the relationship between the temperature of the substrate and the dispersion in the distribution of the carrier density of the doping layer deposited.

FIG. 1 shows the relationship between the temperature of the substrate and the carrier density and FIG. 2 shows the temperature of the substrate and the dispersion in the distribution of the carrier density. As evident from the diagrams, it can be seen that, with an increase of the temperature of the substrate, the carrier density decreases and the dispersion in the distribution of the carrier density becomes also small simultaneously and that the carrier density is $8.0 \times 10^{16}$ cm$^{-3}$ and the dispersion in the distribution of the carrier density is suppressed lower than 5% at a temperature of the substrate of 700° to 800° C.

Figure 3:
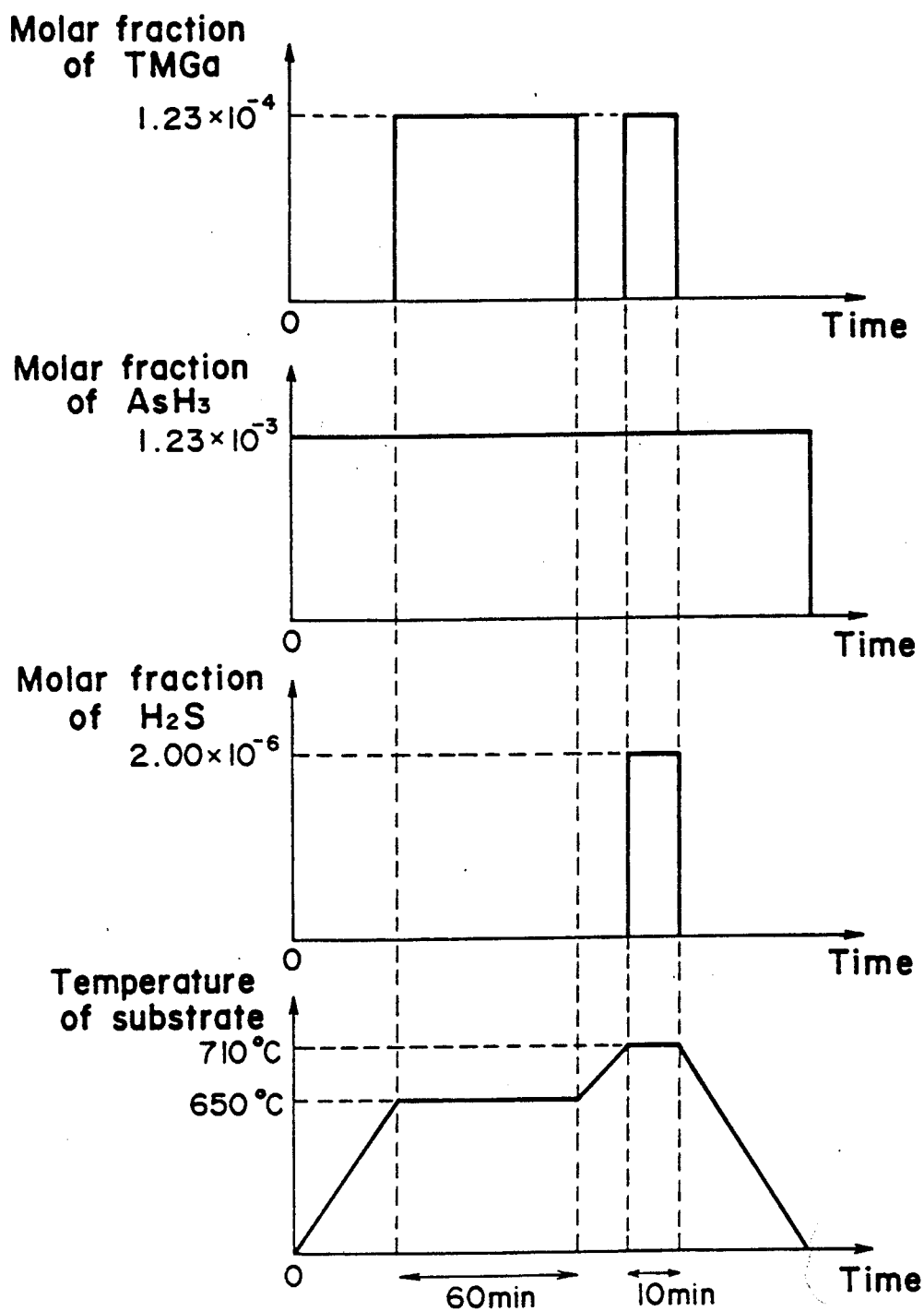
FIG. 3 is an illustration diagram showing one example of the time chart in the vapor deposition method of the invention.

Besides, in the manufacture of epitaxial wafer for field effect transistor as described above, an example of the time chart by which the buffer layer is allowed to deposit onto the substrate making the temperature of the substrate 650° C. and, following this, the doping layer is allowed to deposit onto the buffer layer raising the temperature of the substrate to 710° C. is shown in FIG. 3. Namely, $AsH_3$ is supplied constantly at a rate of molar fraction of $1.23 \times 10^{-3}$ and the substrate is heated. When the temperature of the substrate reached to 650° C., $Ga(CH_3)_3$ is supplied for 60 minutes at a rate of molar fraction of $1.23 \times 10^{-4}$ to allow the buffer layer to deposit onto the substrate. Then, the supply of $Ga(CH_3)_3$ is stopped and the temperature of the substrate is raised from 650° C. to 710° C. Thereafter, by supplying $Ga(CH_3)_3$ again at a rate of molar fraction of $1.23 \times 10^{-4}$ and, at the same time, by supplying $H_2S$ for 10 minutes at a rate of molar fraction of $2.00 \times 10^{-6}$, the doping layer may be allowed to deposit onto the buffer layer.

According to the invention, in the vapor deposition method wherein the doping layer is allowed to deposit onto the GaAs substrate, by raising the temperature of the substrate to 700° to 800° C. and by keeping thereat during the deposition, the dispersion in the distribution of the carrier density within a diameter of 40 mm on the doping layer of wafer with a diameter of 2 inches can be suppressed lower than 5%. Therefore, the invention exerts a remarkable effect in that the elements for electronic devices can be made out efficiently.

What is claimed is:

1. A chemical vapor deposition technique for depositing doped thin films of GaAs, comprising: depositing a high resistant buffer layer of GaAs on a GaAs substrate by gaseous reaction of a mixture of arsine gas and trimethylgallium in the gas phase over said substrate while the temperature of the substrate is maintained within the range of 600°–700° C.;

stopping the supply of trimethylgallium to the gas mixture undergoing reaction and increasing the temperature of the substrate to within the range of 700°–800° C.; and then resuming the supply of trimethylgallium to and supplying hydrogen sulfide to the gas phase over a substrate at the stated temperature, thereby depositing a doped GaAs layer over the buffer layer on the substrate having a distribution of carrier density of less than 5%.

2. The chemical vapor deposition technique of claim 1, wherein said highly resistant buffer layer of GaAs is deposited to a thickness ranging from 2–3 μm.

3. The chemical vapor deposition technique of claim 1, wherein the ratio of arsenic to gallium in the gaseous reaction mixture of the first step ranges between 10 and 20.

4. The chemical vapor deposition technique of claim 1, wherein the doped GaAs layer has a thickness of about 0.5 μm.

* * * * *

UNITED STATES PATENT AND TRADEMARK OFFICE
CERTIFICATE OF CORRECTION

PATENT NO. : 5,037,674

DATED : August 6, 1991

INVENTOR(S) : Seiji Kojima et al.

It is certified that error appears in the above-identified patent and that said Letters Patent is hereby corrected as shown below:

ON THE TITLE PAGE:

The Related U.S. Application Data is incorrect, should be,

--[63] Continuation of Ser. No. 307,499, Feb. 8, 1989, abandoned, which is a continuation of Ser. No. 204,974, Jun. 3, 1988, abandoned, which is a continuation of Ser. No. 868,142, May 29, 1986, abandoned.--

Signed and Sealed this

Twenty-third Day of February, 1993

Attest:

STEPHEN G. KUNIN

Attesting Officer

Acting Commissioner of Patents and Trademarks